United States Patent
Li et al.

(10) Patent No.: US 8,977,924 B2
(45) Date of Patent: Mar. 10, 2015

(54) OPTIMIZED MECHANISM TO SIMPLIFY THE CIRCULANT SHIFTER AND THE P/Q KICK OUT FOR LAYERED LDPC DECODER

(75) Inventors: Zongwang Li, Dublin, CA (US);
Chung-Li Wang, San Jose, CA (US);
Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 119 days.

(21) Appl. No.: 13/607,907

(22) Filed: Sep. 10, 2012

(65) Prior Publication Data

US 2014/0075261 A1    Mar. 13, 2014

(51) Int. Cl.
*H03M 13/00*    (2006.01)
*H03M 13/11*    (2006.01)

(52) U.S. Cl.
CPC ........ *H03M 13/1111* (2013.01); *H03M 13/116* (2013.01); *H03M 13/114* (2013.01)
USPC ...................................................... 714/752

(58) Field of Classification Search
USPC ...................................................... 714/752
See application file for complete search history.

(56) References Cited

U.S. PATENT DOCUMENTS

| 7,178,080 | B2 | 2/2007 | Hocevar |
| 7,934,140 | B2 | 4/2011 | Oh et al. |
| 8,185,807 | B2 | 5/2012 | Oh et al. |
| 8,769,382 | B1 * | 7/2014 | Varnica et al. ............. 714/774 |
| 2008/0301521 | A1 * | 12/2008 | Gunnam et al. ............. 714/757 |
| 2010/0042891 | A1 * | 2/2010 | Gunnam et al. ............. 714/752 |
| 2011/0102086 | A1 * | 5/2011 | Lin et al. ............. 330/257 |
| 2011/0264979 | A1 * | 10/2011 | Gunnam et al. ............. 714/752 |
| 2013/0205182 | A1 * | 8/2013 | Adas et al. ............. 714/763 |
| 2013/0247663 | A1 * | 9/2013 | Patel ............. 73/504.12 |

OTHER PUBLICATIONS

Author: Shuang Zhao, Xiaofang Zhou, Fanglong Ying and Gerald E. Sobelman; Title: Memory Size Reduction for LDPC Layered Decoders; Publisher IEEE 978-1-4244-7456-1/10; Date 2010.*

* cited by examiner

*Primary Examiner* — April Y Blair
*Assistant Examiner* — Thien D Nguyen
(74) *Attorney, Agent, or Firm* — Suiter Swantz pc llo

(57) ABSTRACT

A layered LDPC decoder architecture includes a single MUX and a single shifter element for processing an optimized LDPC parity check matrix. The optimized LDPC parity check matrix may be a K×L sub-matrix having zero elements, non-zero elements defined by a circulant matrix or zero matrices, and identity matrixes.

20 Claims, 7 Drawing Sheets

$$P_{i,j} = \begin{bmatrix} 0 & \alpha & 0 & \cdots & 0 \\ 0 & 0 & \alpha & \cdots & 0 \\ \cdots & \cdots & \cdots & \ddots & \cdots \\ 0 & 0 & 0 & \cdots & \alpha \\ \alpha & 0 & 0 & \cdots & 0 \end{bmatrix}$$

OPTIMIZED MECHANISM TO SIMPLIFY THE CIRCULANT SHIFTER AND THE P/Q KICK OUT FOR LAYERED LDPC DECODER

FIELD OF THE INVENTION

The present invention is directed generally toward low-density parity-check (LDPC) codes and more particularly toward efficient LDPC matrixes and decoding architecture.

BACKGROUND OF THE INVENTION

In most real signal transmission applications there can be several sources of noise and distortions between the source of the signal and its receiver. As a result, there is a strong need to correct mistakes in the received signal. As a solution for this task one should use some coding technique with adding some additional information (i.e., additional bits to the source signal) to ensure correcting errors in the output distorted signal and decoding it. One type of coding technique utilizes low-density parity-check (LDPC) codes. LDPC codes are used because of their fast decoding (linearly depending on codeword length) property.

Iterative decoding algorithms allows a high degree of parallelism in processing, favoring the design of high throughput architectures of the related decoder. However, routing congestion and memory collision might limit a practical exploitation of the inherent parallelism in a decoding algorithm. In order to solve this problem, codes are designed with a block structure (having blocks of size P) that naturally fit with the vectorization of the decoder architecture, thus guaranteeing a collision-free parallelism of P.

Joint code-decoder design techniques and the possibility of vectorizing the decoder architecture permit a reduction in the iteration latency, because P processing units work in parallel. Consequently, higher throughputs can be achieved with decoder architectures using more than P processing units in parallel; but because of the memory collision problem, the complexity overhead (or even the latency overhead in such processing that cannot be done in parallel) can be significant.

Consequently, it would be advantageous if an apparatus existed that is suitable for efficiently decoding LDPC code words in a layered architecture.

SUMMARY OF THE INVENTION

Accordingly, the present invention is directed to a novel method and apparatus for efficiently decoding LDPC code words in a layered architecture.

On embodiment of the present invention is an LDPC matrix architecture configured for use in a layered LDPC decoding architecture.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which:

FIG. 3 shows a circulant matrix representing an element in a parity check matrix;

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
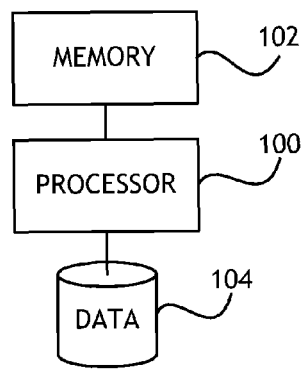
FIG. 1 shows a block diagram of a computer system useful for implementing embodiments of the present invention.

Referring to FIG. 1, a block diagram of a computing device useful for implementing embodiments of the present invention is shown. The computing device may include a processor 100 and memory 102 connected to the processor 100 to store compute executable program code. The processor 100 may implement a multi-layered architecture for LDPC decoding.

Figure 2:
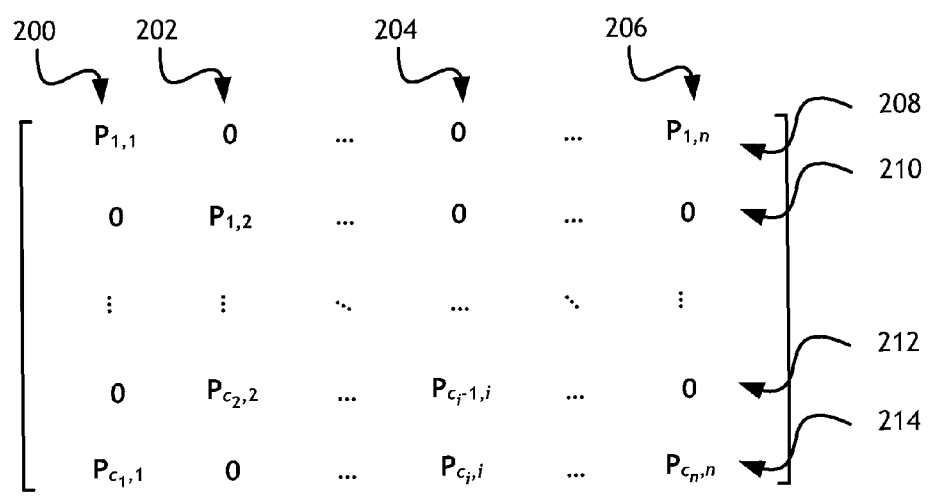
FIG. 2 shows a general parity check matrix for a LDPC decoder.

Referring to FIG. 2, a general parity check matrix for a LDPC decoder is shown. In a parity check matrix, each column 200, 202, 204, 206 represents a check node and each row 208, 210, 212, 214 represents a variable node. Connections between variable nodes and check nodes are represented in the parity check matrix wherever the matrix contains a non-zero value. Each non-zero value in the parity check matrix $(P_{1,1}, P_{1,n}, P_{1,2}, P_{c_2}, P_{c_i-1,i}, P_{c_1,1}, P_{c_i,i}, P_{c_n,n})$ may be a circulant matrix.

Referring to FIG. 3, a circulant matrix representing an element in a parity check matrix is shown such as shown in FIG. 2. Circulant matrixes are square matrixes that are fully defined by a single column. A circulant matrix according to the present invention may include columns having zero elements 300 and non-zero elements 302 that may be defined as an element over a Galois Field having $2^q$ elements.

Figure 4:
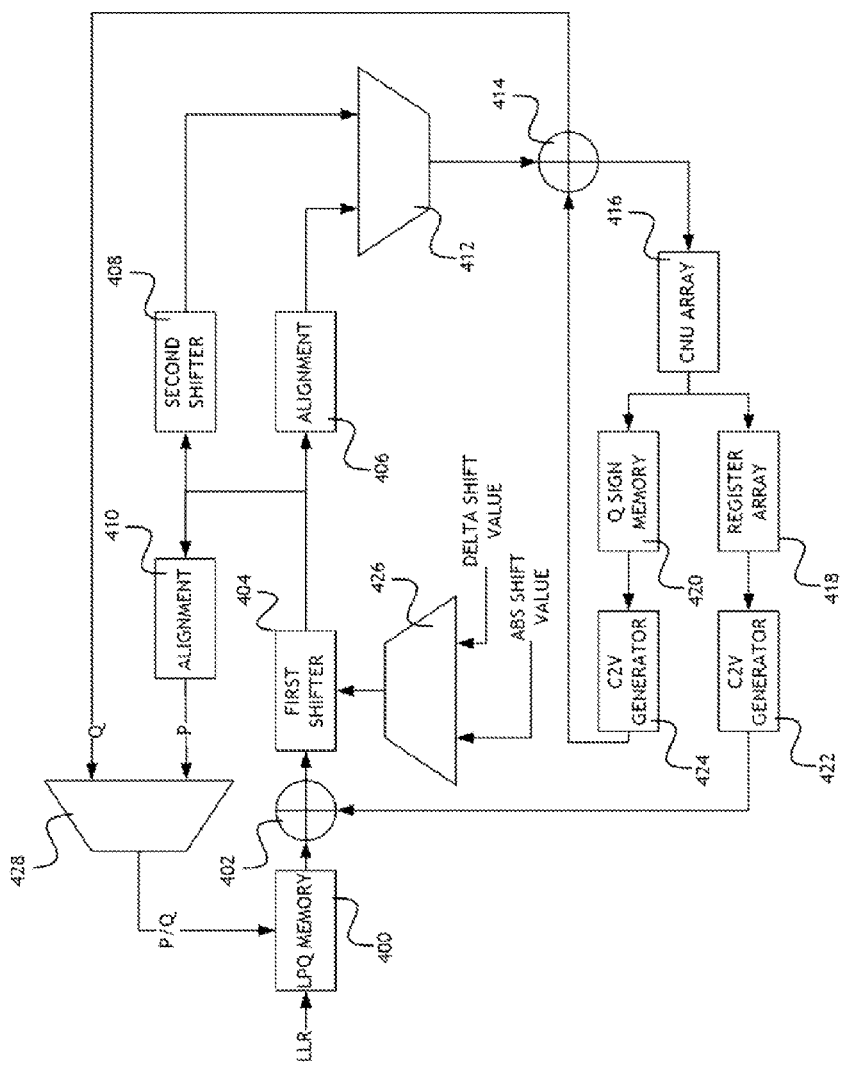
FIG. 4 shows a system architecture for a layered LDPC decoder.

Referring to FIG. 4, a system architecture for a layered LDPC decoder is shown. The layered LDPC decoder may include a ping-pong (LPQ) memory 400. The LPQ memory 400 may store P type messages, Q type messages, log likelihood ratios (LLRs) or some combination or variation thereof. The LPQ memory 400 may receive an initial LLR. The LPQ memory 400 may be connected, through a first additive element 402, to a first shifter element 404. The first shifter element 404 may also be connected to the output of a first MUX 426. The first MUX 426 may receive an absolute (ABS) shift value and a delta shift value as further defined herein. The first MUX 426 may select and send a value to the first shifter element 404. The first shifter element 404 may bit-shift the signal received from the LPQ memory 400 and the first MUX 426. The first shifter element 404 may then send the bit-shifted signal to a first alignment element 406, a second alignment element 410 and a second bit-shifter element 408. The second alignment element 410 may align the bit-shifted signal from the first bit-shifting element 410 to produce a P type message. P type messages are a-posteriori probability (APP) messages computed for a group of variable nodes.

A second MUX 412 may receive a bit-shifted signal from the second bit-shifter element 408 and an aligned signal from the first alignment element 406. The second MUX 412 may select and send a signal to a second additive element 414. The output from the second additive element 414 may comprise a Q type message. Q type messages are messages sent from a group of variable nodes to a group of check nodes. The Q type message from the second additive element 414 and the P type message from the second alignment element 410 may each be received by a third MUX 428 to produce a multiplexed P/Q signal that may comprise an updated LLR that may be received by the LPQ memory 400.

The second additive element 414 may also send its Q type message output to a check node unit (CNU) array 416. The CNU array 416 may include a series of comparators for comparing bits in one or more Q type messages. The output from the CNU array 416 may be sent to a register array 418 and a Q sign memory 420. The register array 418 may store variables from one or more CNUs from the CNU array 416. The Q sign memory 420 may store Q sign bits.

The signal from the register array 418 may be sent to a first capacitance-to-voltage (C2V) generator 422. The output from the Q sign memory 420 may be sent to a second C2V generator 424. The output from the second C2V generator 424 (comprising an old R value) may be sent to the second additive element 414 to be combined with the output from the second MUX 412. The output from the first C2V generator 422 (comprising a new R value) may then be sent to the first additive element 402 to be combined with an LLR from the LPQ memory 400.

By updating the LPQ memory 400 through the second MUX 428 and updating the CNU array 416 through the third MUX 412, the system may iteratively adjust R values in a layered architecture until the system reaches a stable output. The system of FIG. 4 may be operative to decode a generalized LDPC code, but the system requires elements that increase latency and power consumption.

Figure 5:
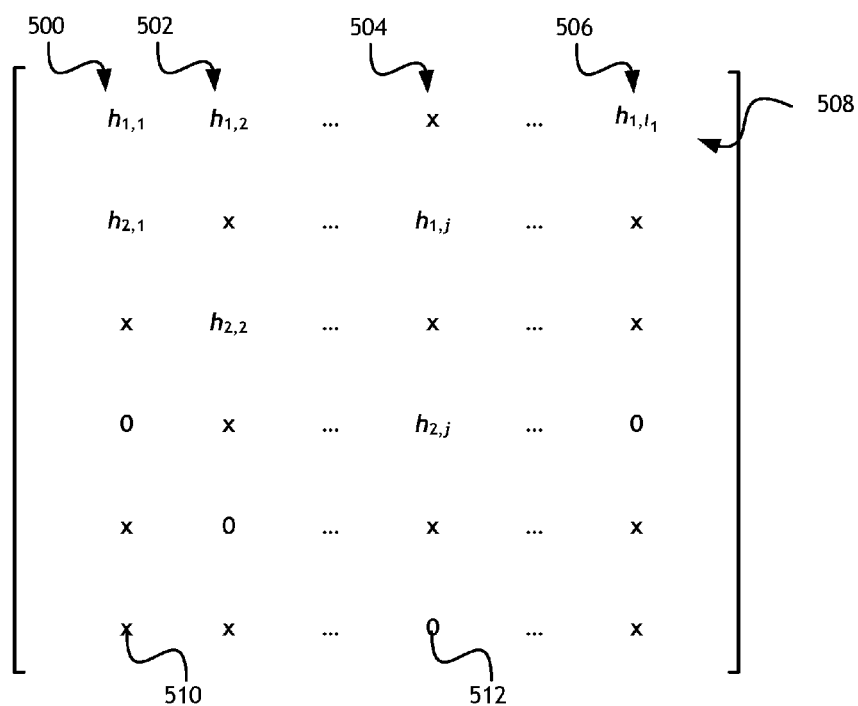
FIG. 5 shows an absolute shift value matrix.

Referring to FIG. 5, an absolute shift value matrix is shown. In FIG. 5, "0" means no shift; $h_{i,j}$ means right shift $h_{i,j}$ position; "x" means no operation (related to zeros-sub-matrices in the parity check matrix). The absolute shift value matrix is a matrix of values used by a hard decision (HD) memory to shift already shifted hard decisions to their original order (input order) to perform a convergence check. Each column 500, 502, 504, 506 may include shift values with the last shift value in each column 500, 502, 504, 506 equal to zero. Each row 508 may have a weight that is an even or odd number. Layered decoder processes may process a predefined number of non-zero matrices (the elements in the absolute shift value matrix except "x") in a row 508. The absolute shift value matrix may include zero elements 510 corresponding to identity sub-matrices in the parity-check matrix of the LDPC code.

Figure 6:
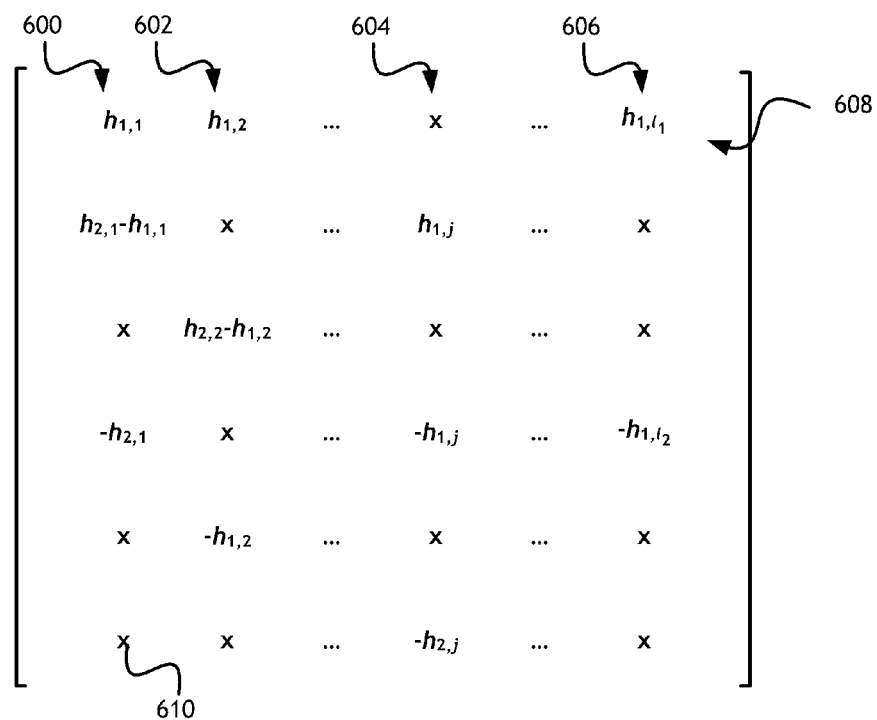
FIG. 6 shows a delta shift value matrix.

Referring to FIG. 6, a delta shift value matrix is shown. The delta shift value matrix is a matrix of values used by layered decoder processes to shift all shifted hard decisions and LLRs that are already shifted by a previous layer processing. For example, in a first layer, data from a first circulant may be shifted by $h_{1,1}$ and stored in LPQ memory; then in a second layer, the data in the LPQ memory may be read and shifted by $h_{1,2}$-$h_{1,1}$ for a total offset of $h_{1,2}$. Each column 600, 602, 604, 606 may include shift values with a sum equal to zero. Layered decoder processes may process a predefined number of non-zero matrices in a row 608. The delta shift value matrix may include "x" elements 610 corresponding to zero matrixes in the parity-check matrix of the LDPC code.

Figure 7:
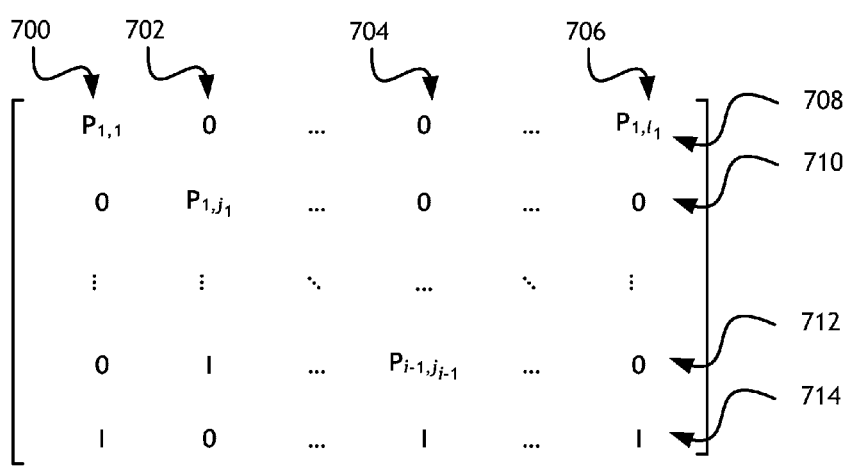
FIG. 7 shows an optimized parity check matrix for a layered LDPC decoder.

Referring to FIG. 7, an optimized parity check matrix for a layered LDPC decoder is shown. An optimized parity check matrix may be a K×L matrix having zero elements 702, non-zero elements defined by a circulant matrix such as shown in FIG. 3 or zero matrices, and identity matrixes 704 which are shown in the very last non-zeros matrices of each column.

Figure 8:
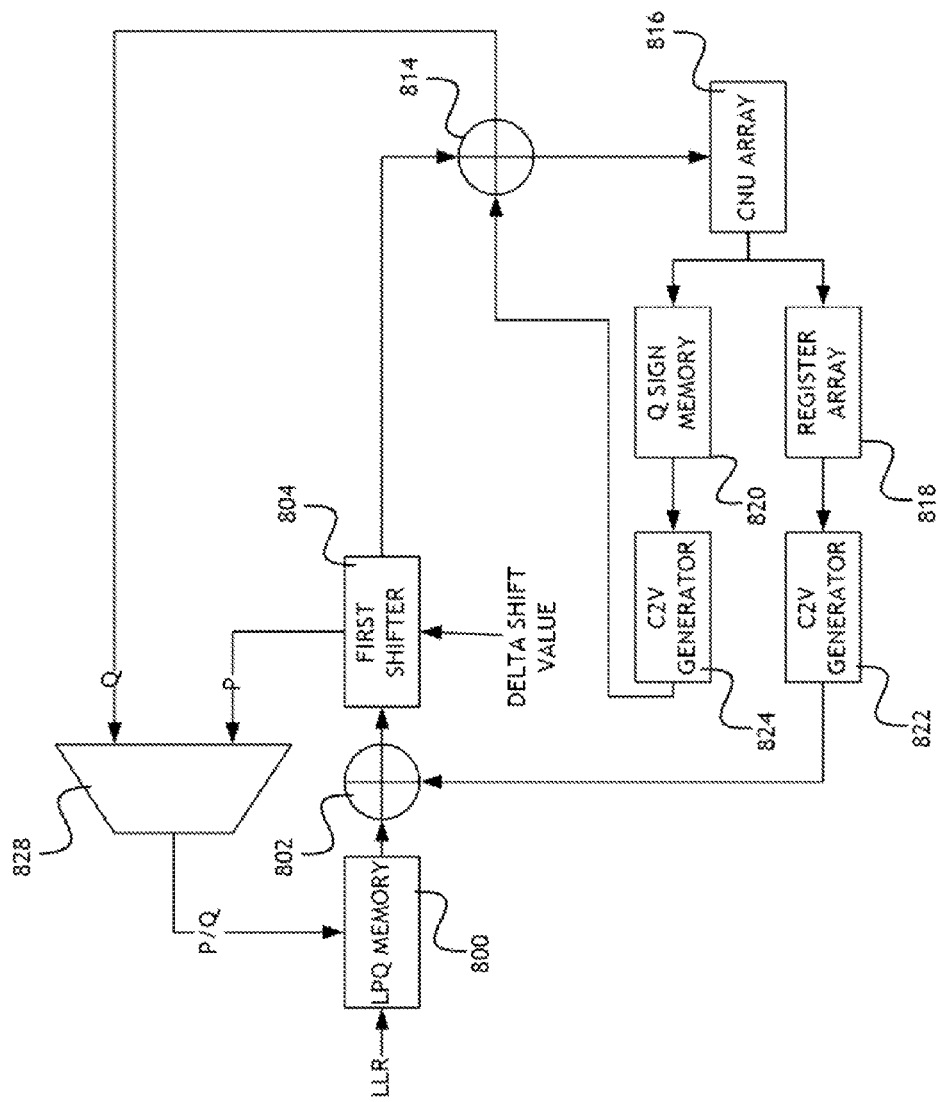
FIG. 8 shows an optimized system architecture for a layered LDPC decoder.

Referring to FIG. 8, an optimized system architecture for a layered LDPC decoder is shown. The optimized layered LDPC decoder may utilize an optimized layered parity check matrix such as shown in FIG. 7. The layered LDPC decoder may include LLR ping-pong (LPQ) memory 800. The LPQ memory 800 may store P type messages, Q type messages, log likelihood ratios (LLRs) or some combination or variation thereof. The LPQ memory 800 may receive an initial LLR. The LPQ memory 800 may be connected, through a first additive element 802, to a shifter element 804. The shifter element 804 may also receive a delta shift value such as defined in FIG. 6. The shifter element 804 may then send a bit-shifted signal to a second additive element 814 and a MUX 828. The bit-shifted signal from the shifter element 804 may be a P type message. The output from the second additive element 814 may comprise a Q type message. The MUX 828 may produce a multiplexed P/Q signal that may comprise an updated LLR that may be received by the LPQ memory 800.

The second additive element 814 may also send its Q type message output to a CNU array 816. The CNU array 816 may include a series of comparators for comparing bits in one or more Q type messages. The output from the CNU array 816 may be sent to a register array 818 and a Q sign memory 820. The register array 818 may store variables from one or more CNUs from the CNU array 816. The Q sign memory 820 may store Q sign bits.

The signal from the register array 818 may be sent to a first C2V generator 822. The output from the Q sign memory 820 may be sent to a second C2V generator 824. The output from the second C2V generator 824 (comprising an old R value) may be sent to the second additive element 814 to be combined with the output from shifter element 804. The output from the first C2V generator 822 (comprising a new R value) may then be sent to the first additive element 802 to be combined with an LLR from the LPQ memory 800.

By updating the LPQ memory 800 through the MUX 828 and updating the CNU array 816 through the shifter element 804, the system may iteratively adjust R values in a layered architecture until the system reaches a stable output. The system of FIG. 8 may be operative to decode an optimized LDPC code.

Figure 9:
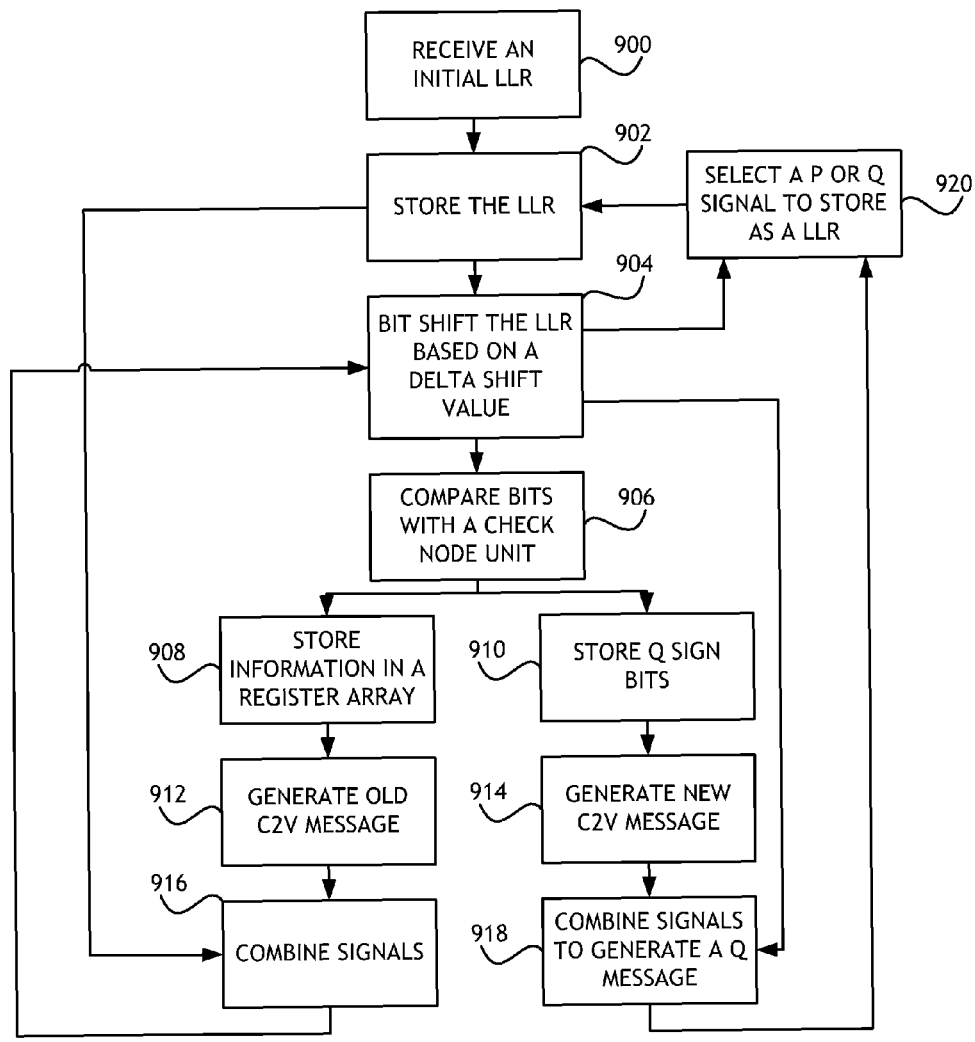
FIG. 9 shows a flowchart of a method for processing an optimized LDPC parity check matrix.

Referring to FIG. 9, a flowchart of a method for processing an optimized LDPC parity check matrix is shown. The method may include receiving 900 an initial LLR. The initial LLR may be stored 902 in a LPQ memory. The LLR may be shifted 904 based on a delta shift value from a delta shift value matrix. Values from two or more variable nodes may be compared 906 to one or more check nodes. Information from such comparison may be stored 908 in a register array. Q sign bit from such comparison may be stored 910 in a Q sign memory. A C2V generator may generate 912 a voltage based on information in the register array. A C2V generator may also generate 914 a C2V message based on Q sign bits in a Q sign memory.

The C2V message based on the stored information may be combined 916 with an LLR stored in a LPQ memory and the result shifted 904 based on a delta shift value from a delta shift matrix to produce a P type message. Likewise, the C2V message based on the Q sign bits may be combined 918 with a bit shifted LLR value to produce a Q type message. A multiplexer may select 920 elements of the P type message and Q type message to produce a signal, and the resulting signal may be stored 902 in a LPQ memory.

By this method, a system for decoding a LDPC code in a layered architecture may utilize an optimized LDPC parity check matrix for low latency.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for decoding a LDPC encoded signal in a layered architecture, comprising:
   bit-shifting, with a computer processor, a first signal based on a delta shift value;
   selecting, with a computer processor, a signal from the bit-shifted first signal and a second combined signal, wherein the second combined signal is a combination of at least two signals; and
   storing the selected signal in a ping-pong memory designated for storing some combination of P type messages, Q type messages and log likelihood ratios (LPQ memory).

2. The method of claim 1, further comprising:
   comparing, with a computer processor, bits in the bit-shifted first signal to one or more check nodes to produce a Q sign signal comprising Q sign bits; and
   combining, with a computer processor, the Q sign signal and the bit-shifted first signal to produce the second combined signal.

3. The method of claim 2, wherein the Q sign signal is used by a capacitance-to-voltage generator before being combined with the bit-shifted first signal to generate at least a capacitance-to-voltage message.

4. The method of claim 1, further comprising:
   comparing, with a computer processor, bits in the bit-shifted first signal to one or more check nodes to produce a data set; and
   combining, with a computer processor, the data set and a LPQ signal to produce the first signal.

5. The method of claim 1, further comprising:
   comparing, with a computer processor, bits in the bit-shifted first signal to produce a data set; and
   combining, with a computer processor, the data set and a LPQ signal to produce an updated first signal.

6. The method of claim 5, wherein the data set is used by a capacitance-to-voltage generator before being combined with the first signal to generate at least a voltage.

7. The method of claim 1, further comprising:
   bit-shifting, with a computer processor, the selected signal based on a second delta shift value from a delta shift value matrix;
   comparing, with a computer processor, bits in the bit-shifted selected signal to produce a Q sign signal comprising Q sign bits and a data set;
   combining, with a computer processor, the Q sign signal and the bit-shifted selected signal to produce a Q type signal comprising a Q type message; and
   selecting, with a computer processor, an updated LPQ signal from the bit-shifted selected signal and the Q type signal.

8. An apparatus for decoding a LDPC encoded signal, comprising:
   a processor;
   a memory connected to the processor, at least a portion of the memory comprising a ping-pong memory designated for storing some combination of P type messages, Q type messages and log likelihood ratios; and
   computer executable program code configured to execute on the processor,
   wherein the computer executable program code is configured to instruct the processor to:
   bit-shift a first signal based on a delta shift value;
   select a signal from the bit-shifted first signal and a second combined signal; and
   store the selected signal in the memory.

9. The apparatus of claim 8, wherein the computer executable program code is further configured to instruct the processor to:
   compare bits in the bit-shifted first signal to produce a Q sign signal comprising Q sign bits; and
   combine the Q sign signal and the bit-shifted first signal to produce the second combined signal.

10. The apparatus of claim 9, wherein the computer executable program code is further configured to instruct the processor to utilize the Q sign signal with a capacitance-to-voltage generator before combining the Q sign signal with the bit-shifted first signal to generate at least a capacitance-to-voltage message.

11. The apparatus of claim 8, wherein the computer executable program code is further configured to instruct the processor to:
   compare bits in the bit-shifted first signal to produce a data set; and
   combine the data set and a LPQ signal to produce the first signal.

12. The apparatus of claim 8, wherein the computer executable program code is further configured to instruct the processor to:
   compare bits in the bit-shifted first signal to produce a data set; and
   combine the data set and a LPQ signal to produce an updated first signal.

13. The apparatus of claim 12, wherein the computer executable program code is further configured to instruct the processor to utilize the data set before combining the data set with the first signal to generate at least a voltage based on the data set.

14. The apparatus of claim 8, wherein the computer executable program code is further configured to instruct the processor to:
   bit-shift the selected signal based on a second delta shift value from a delta shift value matrix;
   compare bits in the bit-shifted selected signal to produce a Q sign signal comprising Q sign bits and a data set;
   combine the Q sign signal and the bit-shifted selected signal to produce a Q type signal comprising a Q type message; and
   select an updated LPQ signal from the bit-shifted selected signal and the Q type signal.

15. An apparatus for decoding a LDPC encoded signal, comprising:
   a ping-pong memory designated for storing some combination of P type messages, Q type messages and log likelihood ratios (LPQ memory);
   a first additive element connected to the LPQ memory;
   a shifter connected to the first additive element;
   a second additive element connected to the shifter; and a multiplexer connected to the shifter, the second additive element and the LPQ memory, wherein:

the shifter is configured to receive a first signal from the LPQ memory and receive a delta shift value;

the shifter is configured to send a bit-shifted first signal to the multiplexer and the second additive element;

the second additive element is configured to send a Q type signal comprising a Q type message to the multiplexer; and the multiplexer is configured to send a multiplexed signal to the LPQ memory, wherein the multiplexed signal includes a signal resulting from the combination of at least two signals.

16. The apparatus of claim 15, further comprising a CNU array connected to the second additive element for comparing bits in the bit-shifted first signal to produce a Q sign signal comprising Q sign bits, wherein the second additive element is configured to combine the Q sign signal and the bit-shifted first signal to produce the Q type signal.

17. The apparatus of claim 16, further comprising a first capacitance-to-voltage generator configured to use the Q sign signal to generate at least a capacitance-to-voltage message.

18. The apparatus of claim 15, further comprising a CNU array connected to the second additive element for comparing bits in the bit-shifted first signal to produce a data set, wherein the first additive element is configured to combine the data set signal and a LPQ signal to produce the first signal.

19. The apparatus of claim 18, further comprising a first capacitance-to-voltage generator configured to use the data set to generate at least a voltage.

20. The apparatus of claim 15, further comprising a CNU array connected to the second additive element for comparing bits in the bit-shifted selected signal to produce a Q sign signal comprising Q sign bits and a data set, wherein, the shifter is further configured to bit-shift the selected signal based on a second delta shift value from a delta shift value matrix;

the second additive element is configured to combine a Q sign signal and the bit-shifted selected signal to produce an updated Q type signal comprising a Q type message; and the multiplexer is configured to select an updated LPQ signal from the bit-shifted selected signal and the updated Q type signal.

* * * * *